United States Patent
Kuo et al.

(10) Patent No.: US 9,093,398 B2
(45) Date of Patent: Jul. 28, 2015

(54) BRIGHTNESS ENHANCED SELF-LUMINOUS DISPLAY

(71) Applicant: Industrial Technology Research Institute, Hsinchu (TW)

(72) Inventors: Hui-Lung Kuo, Taipei (TW); Mei-Chih Peng, Taoyuan County (TW); Yi-Chang Du, Miaoli County (TW); Mei-Rurng Tseng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 63 days.

(21) Appl. No.: 13/863,391

(22) Filed: Apr. 16, 2013

(65) Prior Publication Data

US 2014/0097412 A1   Apr. 10, 2014

(30) Foreign Application Priority Data

Oct. 9, 2012   (TW) .............................. 101137332 A (51) Int. Cl.
*H01L 27/32* (2006.01)
*G02B 5/30* (2006.01)
*H01L 51/52* (2006.01)

(52) U.S. Cl.
CPC .............. *H01L 27/3206* (2013.01); *G02B 5/30* (2013.01); *H01L 27/3211* (2013.01); *H01L 51/5281* (2013.01)

(58) Field of Classification Search
CPC ............ H01L 27/3211; H01L 51/5281; G02B 5/3025
USPC ....................................... 257/89, 98; 313/504
See application file for complete search history.

(56) References Cited

U.S. PATENT DOCUMENTS

| 4,287,449 A | 9/1981 | Takeda et al. |
| 5,049,780 A | 9/1991 | Dobrowolski et al. |

(Continued)

FOREIGN PATENT DOCUMENTS

| JP | 61116301 | 6/1986 |
| JP | 2005158478 | 6/2005 |
| KR | 20040060093 | 7/2004 |

OTHER PUBLICATIONS

Alexey N. Krasnov, "High-contrast organic light-emitting diodes on flexible substrates," Applied Physics Letters 80 (20), May 20, 2002, pp. 3853-3855.

(Continued)

*Primary Examiner* — Mark Prenty
(74) *Attorney, Agent, or Firm* — Jianq Chyun IP Office (57) ABSTRACT

A brightness enhanced self-luminous type display including a self-luminous display panel and a brightness enhancement stacked layer is provided. The self-luminous display panel includes pixels arranged in array, wherein each pixel includes light-emitting sub-pixels displaying different colors. The brightness enhancement stacked layer is disposed on the self-luminous display panel. The brightness enhancement stacked layer includes an absorptive polarizer layer, a phase retardation layer and a reflective polarizer layer. The reflective polarizer layer is between the self-luminous display panel and the phase retardation layer. The phase retardation layer is between the absorptive polarizer layer and the reflective polarizer layer. The reflective polarizer layer includes reflective polarizer blocks arranged in array. Each reflective polarizer block is disposed over one of the light-emitting sub-pixels correspondingly, and a wavelength of maximum intensity of each light-emitting sub-pixel is respectively within a wavelength band of light effectively reflected and polarized by the corresponding reflective polarizer block.

11 Claims, 9 Drawing Sheets

(56) References Cited

U.S. PATENT DOCUMENTS

| | | |
|---|---|---|
| 6,476,783 B2 | 11/2002 | Matthies et al. |
| 6,727,967 B2 | 4/2004 | Nakamura et al. |
| 6,841,803 B2 | 1/2005 | Aizawa et al. |
| 7,038,745 B2 * | 5/2006 | Weber et al. .................... 349/96 |
| 7,250,719 B2 | 7/2007 | Yu et al. |
| 7,259,505 B2 | 8/2007 | Cok |
| 7,928,639 B2 * | 4/2011 | Adachi ........................ 313/112 |
| 8,058,783 B2 | 11/2011 | Park et al. |
| 2004/0147200 A1 | 7/2004 | Urabe et al. |
| 2013/0207539 A1 * | 8/2013 | Fang et al. ................... 313/504 |

OTHER PUBLICATIONS

Yang et al., "Lifetime and Electric Characteristics of Encapsulated Organic Light-Emitting Devices," Japanese Journal of Applied Physics 45 (10A), Oct. 6, 2006, pp. 7766-7770.

Nuijs et al., "Diffraction and scattering at antiglare structures for display devices," Applied Optics 33 (18), Jun. 20, 1994, pp. 4058-4068.

* cited by examiner

BRIGHTNESS ENHANCED SELF-LUMINOUS DISPLAY

CROSS-REFERENCE TO RELATED APPLICATION

This application claims the priority benefit of Taiwan application serial no. 101137332, filed on Oct. 9, 2012. The entirety of the above-mentioned patent application is hereby incorporated by reference herein and made a part of this specification.

TECHNICAL FIELD

The disclosure relates to a brightness enhanced self-luminous display, and more particularly, to a self-luminous display with a brightness enhancement stacked layer.

BACKGROUND

An organic electroluminescence device is a self-luminous luminescence device. Since the research and development teams of Kodak and Cambridge discovered the organic electroluminescence device from 1987, improving the luminous efficiency of the organic electroluminescence device has always been one of primary focus for research and development. The organic electroluminescence device has a relative high contrast ratio in a dark room. However, in a regular daily environment, the contrast ratio is deteriorated due to the organic electroluminescence device is most likely utilized with a metal electrode capable of reflecting ambient light.

The maximum contrast ratio ($CR_{max}$) of a display is the ratio (that is, $L_{max}/L_{min}$) between the luminance ($L_{max}$) of the brightest state and the luminance ($L_{min}$) of the darkest state. Currently, the contrast ratio of commercially available liquid crystal displays may easily reach tens of thousands or even higher. Nevertheless, the luminance ($L_{max}$) of the brightest state and the luminance ($L_{min}$) of the darkest state described above are both measured in the dark room, it will be difficult to reach such high contrast ratio in a general operation environment. In practice, most of the contrast ratio that the display may present in the regular daily environment is less than the maximum contrast ratio ($CR_{max}$). For instance, the contrast ratio of the screen in a living room is different from the contrast ratio of the screen in a cinema. The difference between the contrast ratios arises from the influence of ambient light.

In the actual operation environment, the calculation of contrast ratio usually needs to consider an amount of ambient light ($R_{am}$) that is reflected by the display to the eyes of the user. The amount of light ($R_{am}$) relates to the reflectivity ($R_{sf}$) of the layers in the display and the intensity ($I_{am}$) of ambient light. In other words, the amount of light ($R_{am}$) is equal to the product ($R_{sf}I_{am}$) of the reflectivity ($R_{sf}$) and the intensity ($I_{am}$) of ambient light. Thus, the actual contrast ratio (CR) of a display may be represented by the following equation (1):

$$CR=(L_{max}+R_{am}/L_{min}+R_{am}) \quad (1)$$

The metal electrode of an organic electroluminescence display may reflect ambient light, and therefore, the organic electroluminescence display panel easily reflects an ambient image to human eyes. The reflected ambient image overlaps with an image intended to be displayed by the panel, such that the display quality of the organic electroluminescence display may be deteriorated.

In view of the above, to improve the brightness of an organic electroluminescence display and to block the ambient light that reflected by its metal electrodes has become one of the research topics to people having ordinary skill in the pertinent field.

SUMMARY

Accordingly, the disclosure is directed to a self-luminous display having a brightness enhancement stacked layer to improve the luminous efficiency.

The disclosure provides a self-luminous display including a self-luminous display panel and a brightness enhancement stacked layer. The self-luminous display panel includes a plurality of pixels arranged in array, wherein each of the pixels includes a plurality of light-emitting sub-pixels capable of displaying different colors. A brightness enhancement stacked layer is disposed on the self-luminous display panel, and the brightness enhancement stacked layer includes an absorptive polarizer layer, a phase retardation layer and a reflective polarizer layer. The reflective polarizer layer is located between the self-luminous display panel and the phase retardation layer, and the phase retardation layer is located between the absorptive polarizer layer and the reflective polarizer layer, wherein the reflective polarizer layer includes a plurality of reflective polarizer blocks arranged in array, and each of the reflective polarizer blocks is disposed over one of the light-emitting sub-pixels correspondingly, where a wavelength of maximum intensity of each of the light-emitting sub-pixels is respectively within a wavelength band of light effectively reflected and polarized by the corresponding reflective polarizer block.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

First Embodiment

Figure 1:
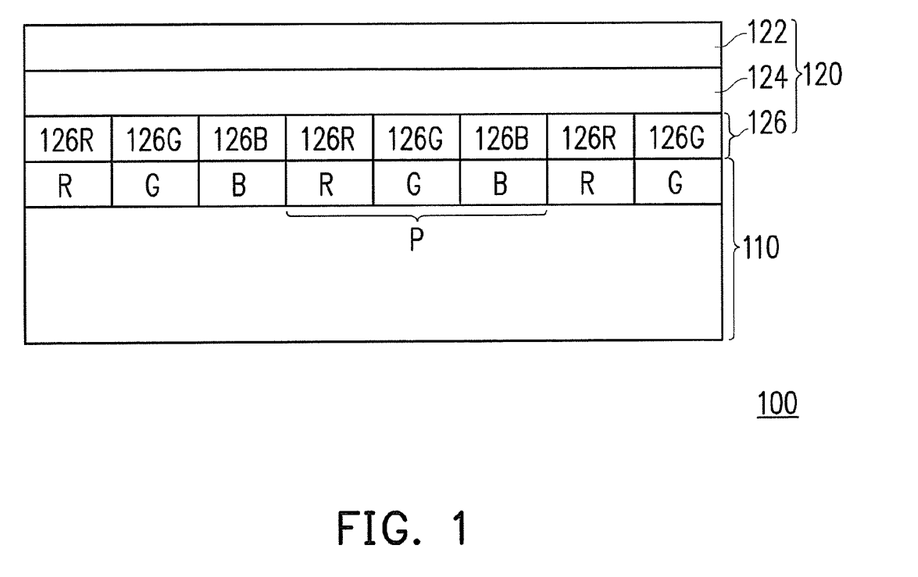
FIG. 1 is a schematic cross-sectional view of a self-luminous display according to a first embodiment of the disclosure.

FIG. 1 is a schematic cross-sectional view of a self-luminous display according to a first embodiment of the disclosure. Referring to FIG. 1, the self-luminous display 100 of the embodiment includes a self-luminous display panel 110 and a brightness enhancement stacked layer 120. The self-luminous display panel 110 includes a plurality of pixels P arranged in array, wherein each of the pixels P includes a plurality of light-emitting sub-pixels R, G, B capable of displaying different colors. The brightness enhancement stacked layer 120 is disposed on the self-luminous display panel 110. The brightness enhancement stacked layer 120 includes an absorptive polarizer layer 122, a phase retardation layer 124 and a reflective polarizer layer 126. The reflective polarizer layer 126 is located between the self-luminous display panel 110 and the phase retardation layer 124, and the phase retardation layer 124 is located between the absorptive polarizer layer 122 and the reflective polarizer layer 126.

Generally, displays are configured to display color images, which are generally based on the three primary colors of red (R), green (G) and blue (B). However, the disclosure is not limited to the three primary colors of red (R), green (G) and blue (B), and other modifications or combinations on colors may be adopted. Herein, the three primary colors are taken as an example, but the disclosure is not limited thereto. Thus, the reflective polarizer layer 126 in the disclosure includes a plurality of reflective polarizer blocks 126R, 126G, 126B arranged in array, and each of the reflective polarizer blocks 126R, 126G, 126B is respectively disposed over the light-emitting sub-pixel R, G or B correspondingly, where a wavelength of maximum intensity of the light-emitting sub-pixel R, G or B is respectively within a wavelength band of light reflected and polarized by the corresponding reflective polarizer blocks 126R, 126G, 126B. For example, wavelength bandwidths of light reflected and polarized by each of the reflective polarizer blocks 126R, 126G and 126B are about 50 nm to 100 nm, and the wavelength bandwidths of each of the reflective polarizer blocks 126R, 126G and 126B may be the same or different from each other. Actually, the wavelength bandwidth of each of the reflective polarizer blocks has an influence on the brightness enhancing and ambient light blocking capabilities. In addition, the wavelength intervals of light effectively reflected and polarized by the reflective polarizer blocks 126R, 126G and 126B may be different from each other.

In the embodiment, the self-luminous display panel 110 is, for instance, an organic electroluminescent display panel. For example, the self-luminous display panel 110 of the embodiment may be a top emission organic electroluminescent display panel or a bottom emission organic electroluminescent display panel. To be specific, when the self-luminous display panel 110 is the top emission organic electroluminescent display panel, the self-luminous display panel 110 includes a substrate, a reflective anode disposed on the substrate, an organic functional layer disposed on the reflective anode and a transparent cathode disposed on the organic functional layer, where the light emitted from the organic functional layer may pass through the transparent cathode, but may not pass through the substrate. When the self-luminous display panel 110 is the bottom emission organic electroluminescent display panel, the self-luminous display panel 110 includes a substrate, a transparent anode disposed on the substrate, an organic functional layer disposed on the transparent anode and a reflective cathode disposed on the organic functional layer, where the light emitted from the organic functional layer may pass through the transparent anode and the substrate sequentially. It should be noted that, whether the reflective cathode in the bottom emission organic electroluminescent display panel or the reflective anode in the top emission organic electroluminescent display panel, these reflective electrodes are usually fabricated by metallic materials, and all of them have relative high reflectivity for ambient light.

Traditionally, a combination of an absorptive polarizer and a quarter wave retardation plate is utilized in order to decrease the ratio of ambient light reflected by the metal electrode so as to prevent the ambient light being reflected to the human eyes, the combination of the polarizer and the quarter wave retardation plate may decrease the ratio of ambient light reflected by the metal electrode, however, a significant part of the light emitted from the organic electroluminescent display is also absorbed by the absorptive polarizer and lose a lot of brightness.

In the embodiment, the light-emitting surface of the self-luminous display panel 110 is disposed with the brightness enhancement stacked layer 120 to further enhance the brightness and the contrast ratio of the self-luminous display 100.

In the embodiment, the absorptive polarizer layer 122 in the brightness enhancement stacked layer 120 is, for instance, a linear polarizer layer which converts the light passed through the layer to be a polarized light. The conversion mechanism is that the light vibrating along one optical axis (namely, the absorption axis) is absorbed and the light vibrating along another optical axis (namely, the transmission axis) passes through, wherein the above-mentioned two optical axes are orthogonal to each other. The light may lose half of the total amount after passing through the absorptive polarizer layer 122.

Generally speaking, the absorptive polarizer layer 122 has a thickness of about 4 μm~250 μm depending on various products or manufacturing processes. The material for making the absorptive polarizer can be chosen from iodine, iodide complex, dichroic dyes and lyotropic liquid crystal type dyes.

The phase retardation layer 124 is generally a quarter-wave film, the in-plane phase retardation value thereof is, for example, between 100 nm and 150 nm at the wavelength of the measuring light about 550 nm. In one embodiment, the ratio of the in-plane phase retardation value of the measuring light at 650 nm to the in-plane phase retardation value of the measuring light at 450 nm is between 1 and 1.4. The phase retardation layer 124 is capable of converting the linear polarized light to the circular polarized light or converting the circular polarized light to the linear polarized light. High polarization conversion efficiency will occur when the optical axis of the phase retardation layer 124 and the optical axis (i.e. transmission axis) of the linear polarizer layer form an angle of about 45 degrees. However, when the angle is not about 45 degrees, the conversion efficiency will be decreased. The phase retardation layer 124 may have a thickness of about 0.5 μm~100 μm depending on various products or manufacturing processes.

In one embodiment, the in-plane phase retardation value of the phase retardation layer 124 depends on the wavelength of measuring light. In another embodiment, for the ambient light blocking purpose here, the phase retardation layer can be negative dispersion type. The "negative dispersion type" phase retardation layer has smaller in-plane phase retardation value at low wavelength and higher in-plane phase retardation value at high wavelength, $R_{450}$, $R_{550}$, and $R_{650}$ represent the in-plane phase retardation values measured at the light wavelength of 450 nm, 550 nm, and 650 nm, respectively. If the in-plane phase retardation values fitted the condition of $R_{450}/R_{550} < R_{650}/R_{550}$, then the phase retardation layer is "negative dispersion type".

The reflective polarizer layer 126 includes a plurality of reflective polarizer blocks 126R, 126G and 126B, wherein the reflective polarizer blocks 126R are capable of reflecting and polarizing red light, the reflective polarizer blocks 126G are capable of reflecting and polarizing green light, and the reflective polarizer blocks 126G are capable of reflecting and polarizing blue light. The materials for building up the reflective polarizer blocks 126R, 126G and 126B can be of different compositions of cholesteric liquid crystals. However, the materials for building up the reflective polarizer blocks 126R, 126G and 126B can also be the same compositions of cholesteric liquid crystals, by different processing conditions, e.g. temperature control, can form different color of reflective polarizer blocks.

Figure 2A:
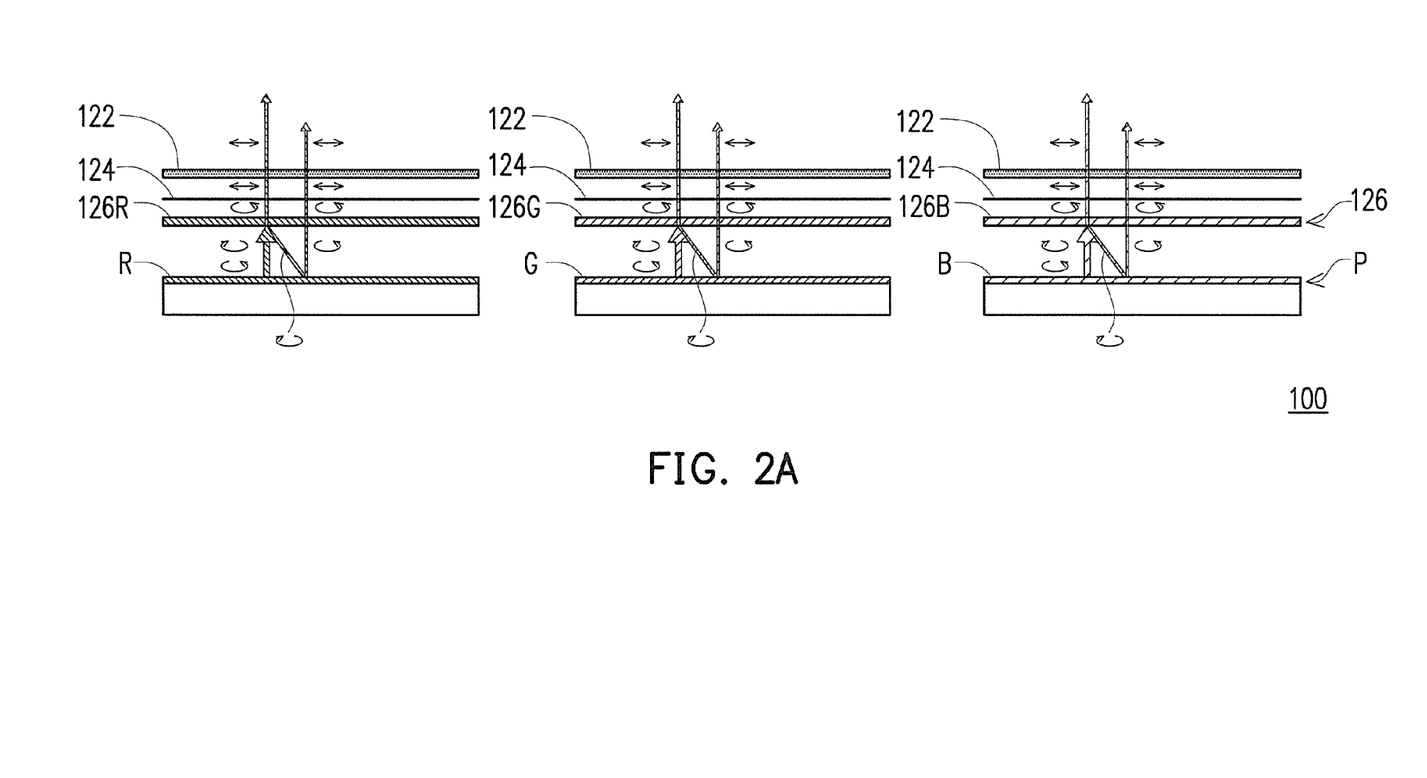
FIG. 2A is a schematic diagram illustrating optical behaviour of a light emitted from a self-luminous display panel 110 in a brightness enhancement stacked layer 120.
Figure 2B:
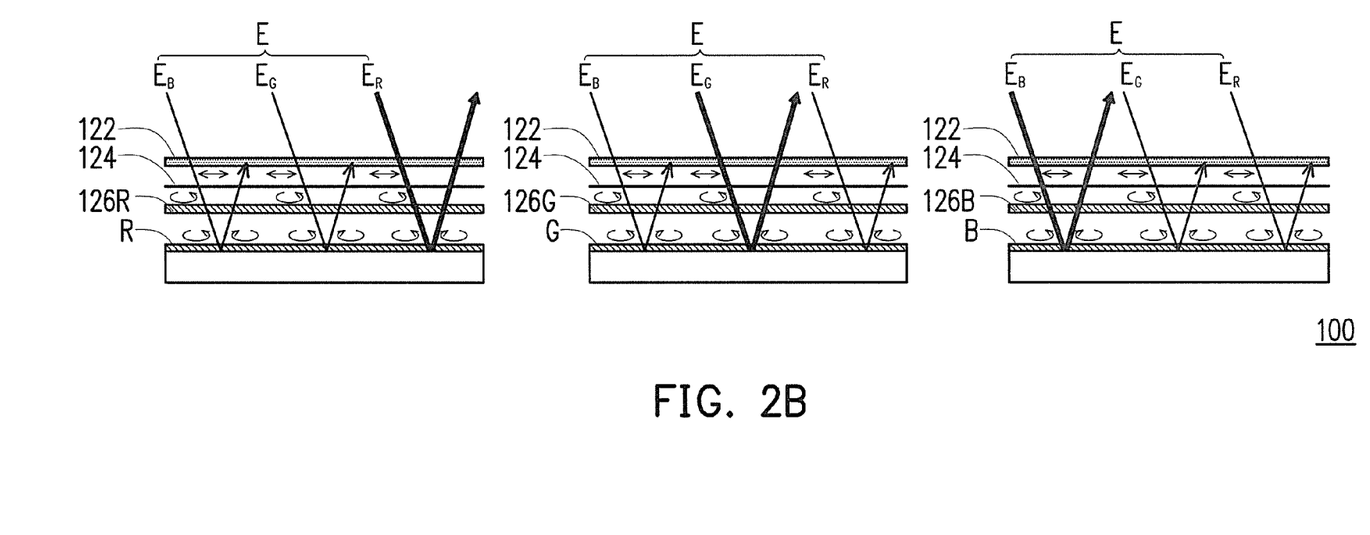
FIG. 2B is a schematic diagram illustrating optical behaviour of ambient light in a self-luminous display 100.

FIG. 2A is a schematic diagram illustrating optical behaviour of a light emitted from the self-luminous display panel 110 with brightness enhancement stacked layer 120, and FIG. 2B is a schematic diagram illustrating optical behaviour of ambient light in the self-luminous display 100. Referring to FIG. 2A, the light-emitting sub-pixel R is, for instance, capable of emitting red light; the light-emitting sub-pixel G is, for instance, capable of emitting green light; and the light-emitting sub-pixel B is, for instance, capable of emitting blue light. The reflective polarizer block 126R is, for instance, a cholesteric liquid crystal material capable of polarizing and reflecting red light; The reflective polarizer block 126G and 126B are also cholesteric liquid crystal material capable of polarizing and reflecting green light and blue light, respectively. Meanwhile, The reflective polarizer blocks 126R, 126G and 126B are disposed above the light-emitting sub-pixels of R, G, and B, respectively. In other words, the reflective polarizer layer 126 of the embodiment is pixelized.

It should be noted that, the reflective polarizer blocks 126R, 126G and 126B may be fabricated by different cholesteric liquid crystal materials or the same cholesteric liquid crystal materials fabricated by different process conditions (such as different process temperatures or different curing times etc), where the cholesteric liquid crystal materials are capable of reflecting and polarizing the light with different wavelength intervals. In an embodiment, the thickness of the reflective polarizer blocks 126R, 126G and 126B may be about 1 μm~10 μm or about 1.5 μm~7 μm.

As shown in FIG. 2A, the blocks 126R, 126G and 126B of the reflective polarizer layer 126 may be a right-handed cholesteric liquid crystal material or a left-handed cholesteric liquid crystal material. The left-handed cholesteric liquid crystal material is exemplified in the following description.

The light-emitting sub-pixel R of the self-luminous display panel 110 is capable of emitting red light. Theoretically, a first part of the red light (for example, half amount of the red light) may pass through the block 126R of the reflective polarizer layer 126, and is a right-handed circular polarized light. It will then converted to a linear polarized light when it passes through the phase retardation layer 124, and the linear polarized light is substantially parallel to the transmission axis of the absorptive polarizer layer 122, thereby passing through the absorptive polarizer layer 122. On the other hand, the second part of the red light (that is the rest of the red light) is then reflected by the reflective polarizer block 126R, and is a left-handed circular polarized light. The left-handed circular polarization polarized light will be reflected by the metal electrode in the light-emitting sub-pixel R, and then converted to the right-handed circular polarized light. By the same mechanism of the first part of the red light, the second part of the red light can pass through the absorptive polarizer layer 122. Finally, the emitted red light from the light-emitting sub-pixel R may pass through and hardly lose any of the light according to the aforementioned optical behaviour, thereby enhancing the luminance of the red light.

The same optical mechanism can be applied to the light-emitting sub-pixels G and B of the self-luminous display panel 110. Theoretically, all the light emitted by the light-emitting sub-pixel will pass through the absorptive polarizer layer 122, and hardly lose.

It can be realized from FIG. 2A that, the brightness is decreased due to the existence of the absorptive polarizer layer 122. However, when the reflective polarizer layer 126 having the reflective polarizer blocks 126R, 126G and 126B is installed, the improvement of brightness is obtained.

Referring to FIG. 2B, when the ambient light E enters the self-luminous display 100, the non-polarized ambient light E may pass through the absorptive polarizer layer 122 and being polarized, and then appears to be a linear polarized light. Theoretically, only half of the intensity is remained. The linear polarized light may pass through the phase retardation layer 124, and then is converted to a right-handed circular polarized light, where the right-handed circular polarized light may pass through the blocks 126R, 126G and 126B of the reflective polarizer layer 126. Subsequently, the right-handed circular polarized light passed through the reflective polarizer blocks 126R, 126G and 126B may be reflected by the metal electrode of each of the light-emitting sub-pixels R, G, B, and then is converted to a left-handed circular polarized light. The left-handed circular polarized light that reflected from the metal electrodes passes through the reflective polarizer blocks 126R, 126G, 126B respectively. Taking the reflective polarizer block 126R as an example, the reflection band thereof is within the wavelength band of red light. Therefore, only the red light $E_R$ of the left-handed circular polarized light is reflected again by the reflective polarizer block 126R to the metal electrode, where this part of the light reflected by the metal electrode and converted to the right-handed circular polarized light, and then is capable of passing through the reflective polarizer block 126R. The rest part of light, said G (green) and B (blue) light may pass through the phase retardation layer 124 again, and then is converted to the linear polarized light, where the polarization direction of the linear polarized light of G (green) and B (blue) light are substantially parallel to the absorption axis of the absorptive polarizer layer 122 (namely, the linear polarizer layer), and are absorbed. All the reflective light from the metal electrode is composing $E_R+E_G+E_B$, by the mechanism mentioned above, only $E_R$ can pass through and $E_G+E_B$ are absorbed at R sub-pixel. It can be concluded that the ambient light was already absorbed at least 50% when it first hits the absorptive polarizer layer 122 and the rest part of the ambient light was absorbed more than ⅔ by the mechanism described above. In some embodiments, there was a little portion of the ambient light reflected and detected. In other embodiments, the effectively bandwidth of the reflective polarizer block can be modified to give higher absorption part of ambient light. The same mechanism will applied at the light-emitting sub-pixel G and B. Hence, the self-luminous display 100 including the pixelized reflective polarizer blocks 126R, 126G and 126B may reduce the ambient light being reflected significantly and simultaneously increase the brightness of the self-luminous display 100.

It can be realized from FIG. 2B that, the reflective polarizer blocks 126R, 126G and 126B may decrease the reflection of the ambient light, which are facilitated to improve the contrast ratio of the self-luminous display 100.

It should be noted that, each of the pixels P in this disclosure is not limited to be constituted of the red light-emitting sub-pixel R capable of emitting red light, the green light-emitting sub-pixel G capable of emitting green light and the blue light-emitting sub-pixel B capable of emitting blue light (which means the R-G-B three light-emitting sub-pixels design). Each of the pixels P in the disclosure may also applied to the R-G-G-B four light-emitting sub-pixels design or the R-G-B-W four light-emitting sub-pixels design, wherein W means a white light-emitting sub-pixel capable of emitting white light. The design of the reflective polarizer blocks in the reflective polarizer layer 126 should be changed when the arrangement of the light-emitting sub-pixels changes.

Figure 3A:
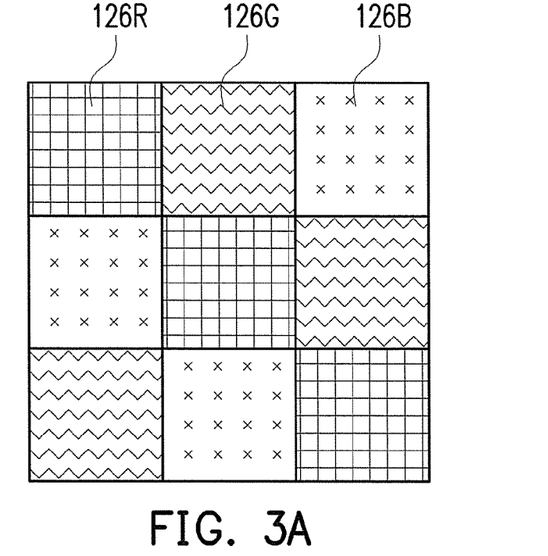
FIG. 3A through FIG. 3F are schematic diagrams illustrating different types of reflective polarizer blocks.
Figure 3B:
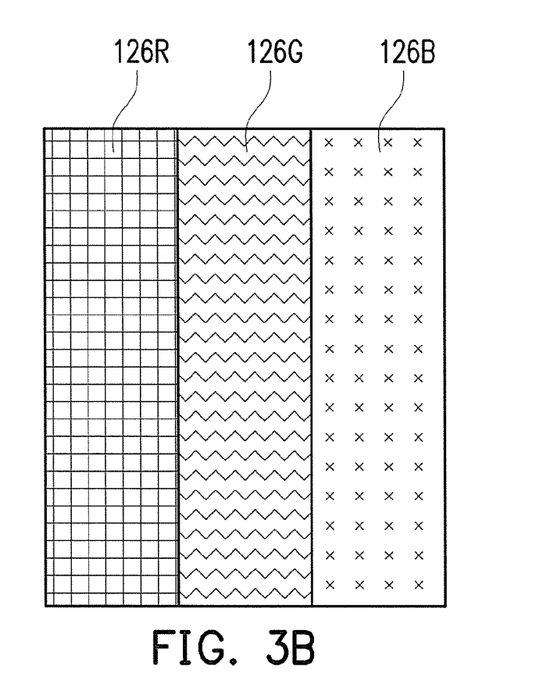
Figure 3C:
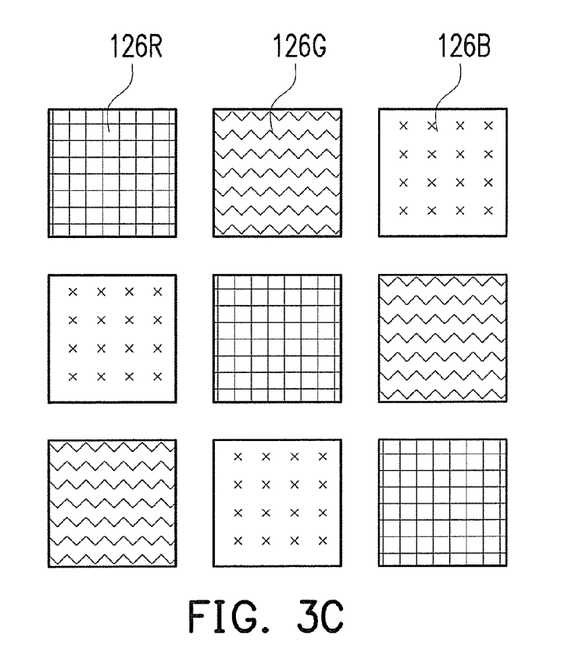
Figure 3D:
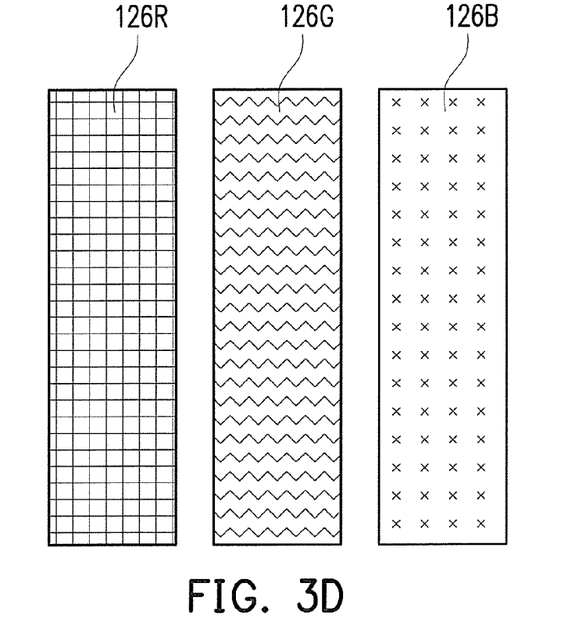
Figure 3E:
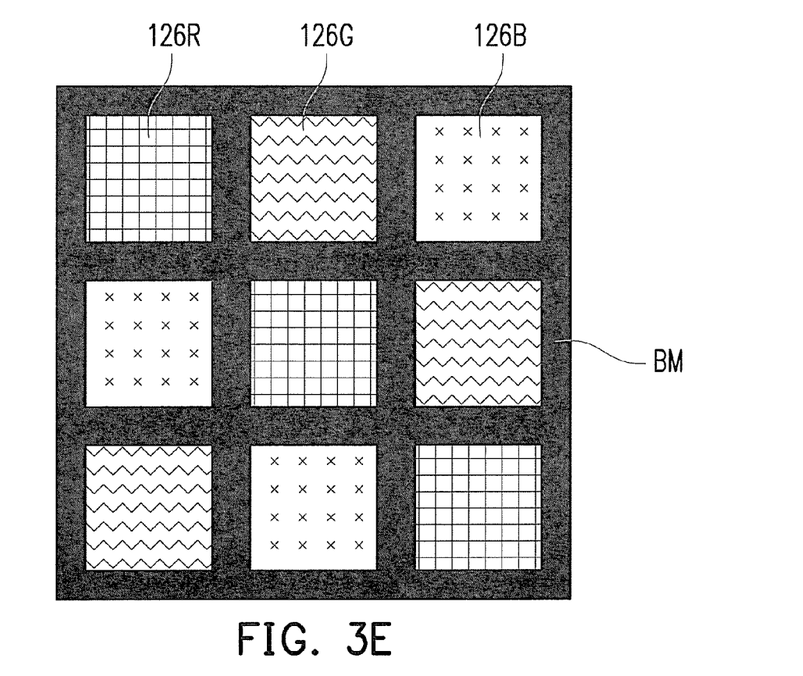
Figure 3F:
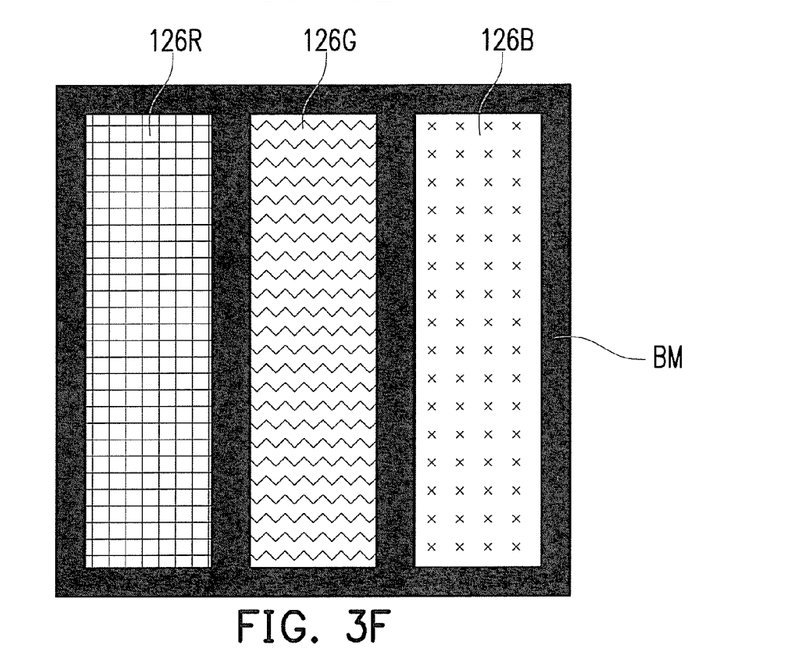

FIG. 3A through FIG. 3F are schematic diagrams illustrating different types of reflective polarizer blocks. Referring to FIG. 3A through FIG. 3F, the reflective polarizer blocks 126R, 126G, 126B of the embodiment may be adjacent to each other (as shown in FIG. 3A and FIG. 3B) or separated from each other. In some embodiments, any two adjacent reflective polarizer blocks 126R, 126G or 126B may be separated by trenches, where the width of the trenches is about 1/10 of the width of the reflective polarizer blocks 126R, 126G, 126B or less than 1/10 of the width of the reflective polarizer blocks 126R, 126G, 126B (as shown in FIG. 3C and FIG. 3D). In addition, the reflective polarizer blocks 126R, 126G, 126B of the embodiment may also be separated by a black matrix BM (as shown in FIG. 3E and FIG. 3F). In some embodiments, the black matrix BM is fabricated by dark-color pigments. For example, the black matrix BM is fabricated by a black pigment.

Experimental Data

Figure 4:
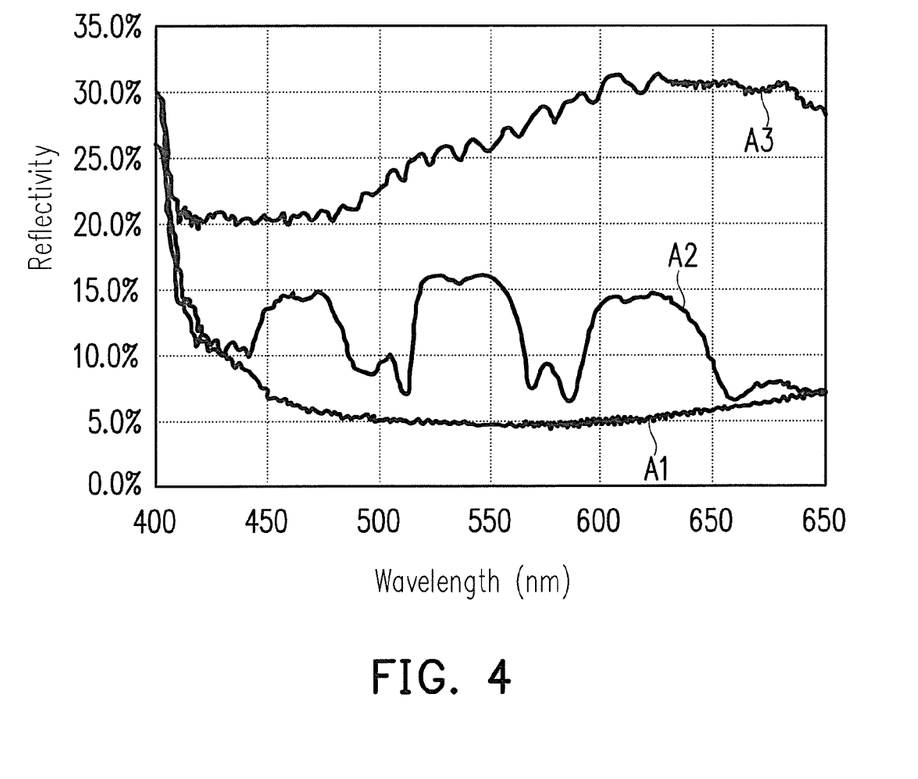
FIG. 4 is a schematic diagram showing the reflectivity of ambient light for different types of self-luminous displays.

FIG. 4 is a schematic diagram showing the reflectivity of ambient light for different types of self-luminous displays. Referring to FIG. 4, the curve A1 is the reflectivity of ambient light for the combination of an absorptive polarization plate and a quarter wave retardation plate (P+QWF) disposed on the self-luminous display panel; the curve A2 is the reflectivity of ambient light for the combination of the absorptive polarization plate, the quarter wave retardation plate and a pixelized reflective polarizer layer (P+QWF+R, G, B) disposed on the self-luminous display panel; and the curve A3 is the reflectivity of ambient light for the combination of the absorptive polarization plate, the quarter wave retardation plate and a non-pixelized Broad Band type of reflective polarizer layer (P+QWF+BBCP) disposed on the self-luminous display panel. The quarter wave retardation plate is negative dispersion type. The in-plane phase retardation value of the quarter wave retardation plate is 150 nm at the wavelength of a measuring light about 650 nm (Ro(650)=150), the in-plane phase retardation value of the quarter wave retardation plate is 113 nm at the wavelength of a measuring light about 450 nm (Ro(450)=113), and the ratio of Ro(650)/Ro(450) is 1.33.

It is clearly indicated by the curves A2 and A3 in FIG. 4 that, the pixelized reflective polarizer layer of the disclosure is facilitated to decrease the reflectivity of the ambient light for the metal electrode in the self-luminous display panel, in comparison with the non-pixelized Broad Band type of reflective polarizer layer in the combination (P+QWF+ "BBCP"). Herein, the thickness of each of the reflective polarizer blocks 126R, 126G and 126B is about 3 μm~5 μm, and the wavelength bandwidth of light effectively being reflected and polarized by the reflective polarizer blocks 126R, 126G and 126B is about 60 nm.

The disclosure may simultaneously increase the intensity of each color light in the self-luminous display and decrease the reflectivity of the ambient light for the metal electrode in the self-luminous display panel.

The following data in Table 1 represents the measurement intensity of each color light of a self-luminous display having the reflective polarizer blocks 126R, 126G, 126B (namely, the brightness enhancement layer).

TABLE 1

| | Light color | | |
|---|---|---|---|
| | Blue | Green | Red |
| | Representative wavelength | | |
| | 454 nm | 521 nm | 610 nm |
| | Intensity (ratio) | Intensity (ratio) | Intensity (ratio) |
| P + QWF | 3022 (1.00) | 2889 (1.00) | 1397 (1.00) |
| P + QWF + "R" | 3100 (1.03) | 2919 (1.01) | 1844 (1.32) |
| P + QWF + "G" | 3079 (1.02) | 3913 (1.35) | 1369 (0.98) |
| P + QWF + "B" | 4081 (1.35) | 2968 (1.03) | 1411 (1.01) |
| P + QWF + "BBCP" | 3818 (1.26) | 3753 (1.30) | 1868 (1.34) |

Note 1:
the intensity is the average value of the intensities of the wavelength indicated above ±2 nm.
Note 2:
the ratio benchmark (1.00) is taken from the case of "P + QWF".

It can be realized from Table 1 that, R (the representative wavelength is 610 nm), G (the representative wavelength is 521 nm) and B (the representative wavelength is 454 nm) of the pixelized reflective polarizer layer in the disclosure respectively enhance (or are equivalent to) the intensities of red light, green light and blue light of the pixelized reflective polarizer layer, in comparison with the non-pixelized Broadband type of reflective polarizer layer in the combination (P+QWF+"BBCP").

Second Embodiment

Figure 5:
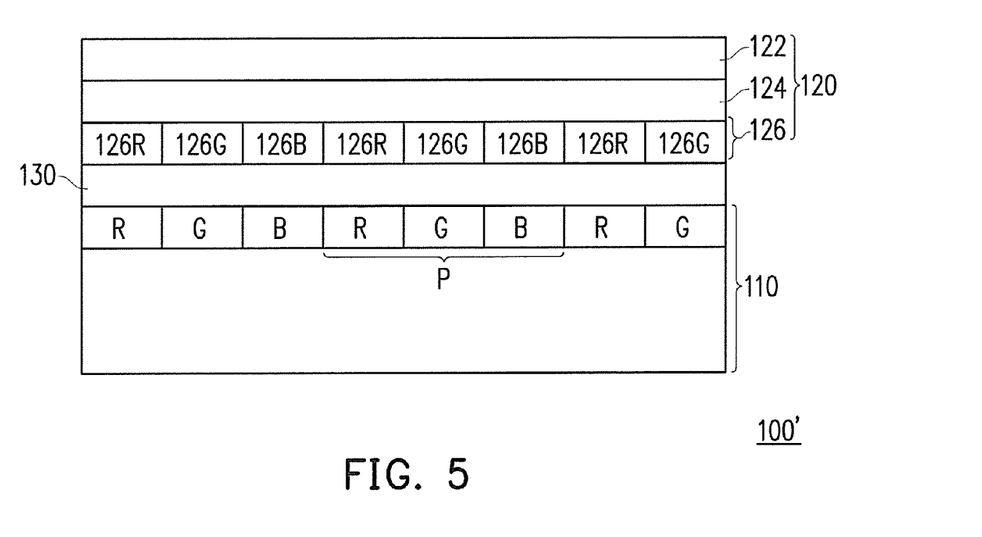
FIG. 5 is a schematic cross-sectional view of a self-luminous display according to a second embodiment of the disclosure.

FIG. 5 is a schematic cross-sectional view of a self-luminous display according to a second embodiment of the disclosure. Referring to FIG. 5, the self-luminous display 100' of the embodiment is similar to the self-luminous display 100 of the first embodiment except that the self-luminous display 100' of the embodiment further includes a first adhesive layer 130 located between the self-luminous display panel 110 and the reflective polarizer layer 126. The first adhesive layer 130 may reduce the surface reflection between the self-luminous display panel 110 and the reflective polarizer layer 126. In addition, the material of the first adhesive layer 130 may be chosen in accordance with the refractive index of the reflective polarizer layer 126 such that the refractive index of the first adhesive layer 130 is close to the refractive index of the reflective polarizer layer 126. The material of the first adhesive layer 130 is, for example, acrylic resin, epoxy resin or polyurethane resin etc.

Third Embodiment

Figure 6:
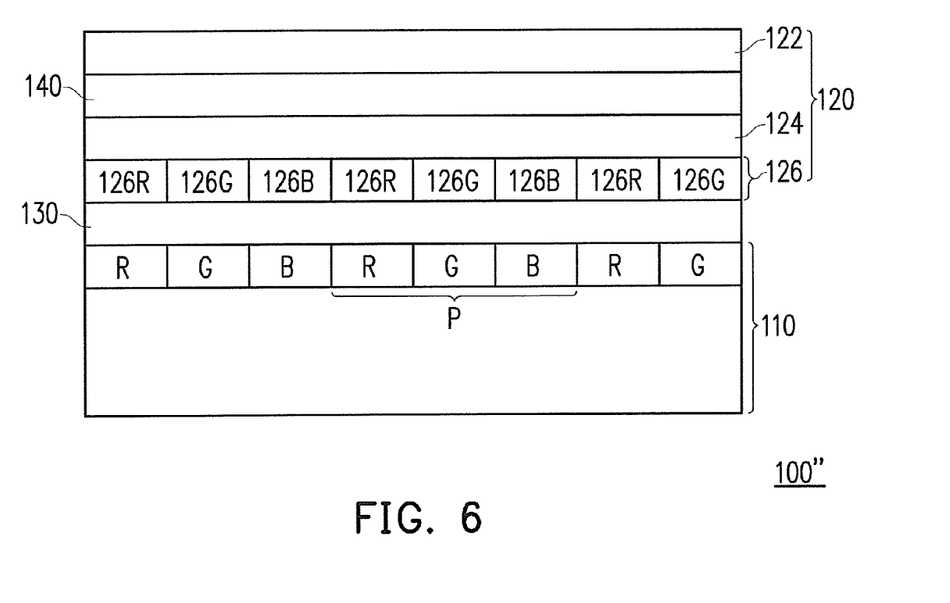
FIG. 6 is a schematic cross-sectional view of a self-luminous display according to a third embodiment of the disclosure.

FIG. 6 is a schematic cross-sectional view of a self-luminous display according to a third embodiment of the disclosure. Referring to FIG. 6, the self-luminous display 100" of the embodiment is similar to the self-luminous display 100 of the first embodiment except that the self-luminous display 100" of the embodiment further includes a first adhesive layer 130 and a second adhesive layer 140, wherein the first adhesive layer 130 is located between the self-luminous display panel 110 and the reflective polarizer layer 126 while the second adhesive layer 140 is located between the phase retardation layer 124 and the absorptive polarizer layer 122. In addition, the material of the second adhesive layer 140 may be chosen in accordance with the refractive index of the phase retardation layer 124 or the absorptive polarizer layer 122 such that the refractive index of the second adhesive layer 140 is close to the refractive index of the phase retardation layer 124 or the absorptive polarizer layer 122. The materials of the second adhesive layer 140 are, for example, acrylic resin, epoxy resin or polyurethane resin etc.

In summary, the brightness enhancement stacked layer provided by the embodiments of the disclosure is capable of reducing the reflection of ambient light from the self-luminous display panel effectively, thereby improving the luminous efficiency (such as, the brightness and the contrast ratio) of the self-luminous display.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A self-luminous display, comprising:
    a self-luminous display panel, comprising a plurality of pixels arranged in array, wherein each of the pixels comprises a plurality of light-emitting sub-pixels capable of displaying different colors;
    a brightness enhancement stacked layer, disposed on the self-luminous display panel, the brightness enhancement stacked layer comprising:
        an absorptive polarizer layer;
        a phase retardation layer; and
        a reflective polarizer layer, wherein the reflective polarizer layer is located between the self-luminous display panel and the phase retardation layer, and the phase retardation layer is located between the absorptive polarizer layer and the reflective polarizer layer, wherein the reflective polarizer layer comprises a plurality of reflective polarizer blocks arranged in array, the reflective polarizer blocks are separated from each other, any two adjacent reflective polarizer blocks are separated by at least one trench, and each of the reflective polarizer blocks is disposed over one of the light-emitting sub-pixels correspondingly, where a wavelength of maximum intensity of each of the light-emitting sub-pixels is respectively within a wavelength band of light reflected and polarized by the corresponding reflective polarizer block.

2. The self-luminous display as claimed in claim 1, wherein the self-luminous display panel comprises an organic electroluminescent display panel.

3. The self-luminous display as claimed in claim 1, wherein the absorptive polarizer layer comprises a linear polarizer layer.

4. The self-luminous display as claimed in claim 1, wherein the in-plane phase retardation value of the phase retardation layer is between 100 nm and 150 nm at the wavelength of a measuring light about 550 nm.

5. The self-luminous display as claimed in claim 1, wherein the in-plane phase retardation dispersion of the phase retardation layer is negative dispersion type.

6. The self-luminous display as claimed in claim 1, wherein the ratio of the in-plane phase retardation value of a measuring light at 650 nm to the in-plane phase retardation value of the measuring light at 450 nm is between 1 and 1.4.

7. The self-luminous display as claimed in claim 1, wherein a material of the reflective polarizer blocks comprises cholesteric liquid crystal.

8. The self-luminous display as claimed in claim 1, wherein wavelength bandwidths of light reflected and polarized by each of the reflective polarizer blocks are about 100 nm.

9. The self-luminous display as claimed in claim 1, wherein wavelength bandwidths of light reflected and polarized by each of the reflective polarizer blocks are about 50 nm.

10. The self-luminous display as claimed in claim 1, further comprising a first adhesive layer located between the self-luminous display panel and the reflective polarizer layer.

11. The self-luminous display as claimed in claim 1, further comprising:
    a first adhesive layer, located between the self-luminous display panel and the reflective polarizer layer; and
    a second adhesive layer, located between the phase retardation layer and the absorptive polarizer layer.

* * * * *